United States Patent
Koeda et al.

(10) Patent No.: US 7,129,028 B2
(45) Date of Patent: Oct. 31, 2006

(54) METHOD OF FORMING HOLOGRAPHIC GRATING

(75) Inventors: Masaru Koeda, Kyoto (JP); Yuji Tanaka, Uji (JP); Akio Soejima, Uji (JP)

(73) Assignee: Shimadzu Corporation, Kyoto (JP)

( * ) Notice: Subject to any disclaimer, the term of this patent is extended or adjusted under 35 U.S.C. 154(b) by 190 days.

(21) Appl. No.: 10/459,463

(22) Filed: Jun. 12, 2003

(65) Prior Publication Data
US 2003/0213768 A1    Nov. 20, 2003

Related U.S. Application Data

(62) Division of application No. 09/735,556, filed on Dec. 14, 2000, now abandoned.

(30) Foreign Application Priority Data

Feb. 25, 2000    (JP) .................... 2000-048686

(51) Int. Cl.
 *G03C 5/00*    (2006.01)
 *B29D 11/00*    (2006.01)
(52) U.S. Cl. .................... 430/325; 430/326; 430/327; 430/328; 430/329; 216/24; 216/41; 216/48
(58) Field of Classification Search ................ 359/576; 522/96, 97; 369/112.07, 112.09, 112.1, 14, 369/37, 44, 103
See application file for complete search history.

(56) References Cited

U.S. PATENT DOCUMENTS

| 4,530,736 | A | * | 7/1985 | Mutter ........................ 216/26 |
| 5,004,673 | A | * | 4/1991 | Vlannes ...................... 430/325 |
| 5,013,494 | A | * | 5/1991 | Kubo et al. ................. 264/1.31 |
| 5,218,471 | A | * | 6/1993 | Swanson et al. ............ 359/565 |
| 5,279,924 | A | * | 1/1994 | Sakai et al. ................. 430/290 |
| 5,340,637 | A | * | 8/1994 | Okai et al. .................. 428/167 |
| 5,643,678 | A | * | 7/1997 | Boswell ...................... 428/467 |
| 5,830,605 | A | * | 11/1998 | Umeki et al. .................. 430/5 |
| 6,613,498 | B1 | * | 9/2003 | Brown et al. ............... 430/322 |

FOREIGN PATENT DOCUMENTS

| JP | 62-231901 | 10/1987 |
| JP | 01-161302 | 6/1989 |
| JP | 07-108612 | 4/1995 |

* cited by examiner

*Primary Examiner*—Duy-Vu N Deo
(74) *Attorney, Agent, or Firm*—Manabu Kanesaka

(57) ABSTRACT

In a method of forming a holographic grating, a photoresist layer is formed on an optical substrate, and a resist pattern is formed in the photoresist layer to have grooves depth deeper than a predetermined depth of diffraction grating grooves to be formed. Then, the photoresist layer with the resist pattern is etched by an ion beam generated by a mixed gas containing a fluorine based gas and oxygen until the resist pattern is substantially completely disappears. Thus, the diffraction grating grooves having the predetermined depth are directly engraved on the optical glass plate.

7 Claims, 3 Drawing Sheets

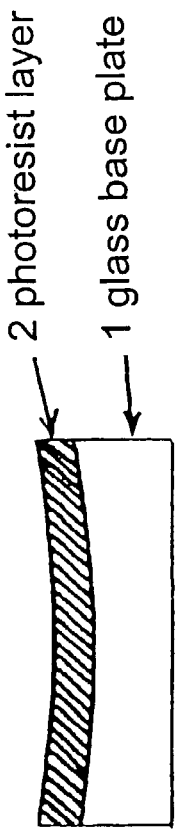
Fig. 1(a)
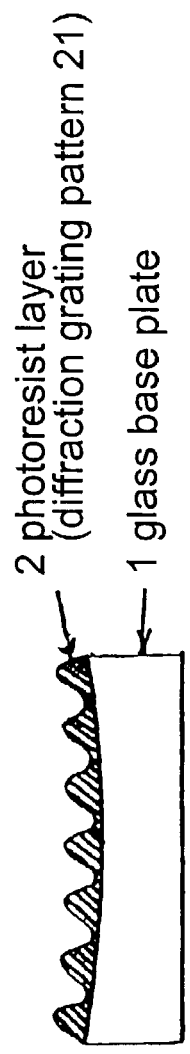
Fig. 1(b)
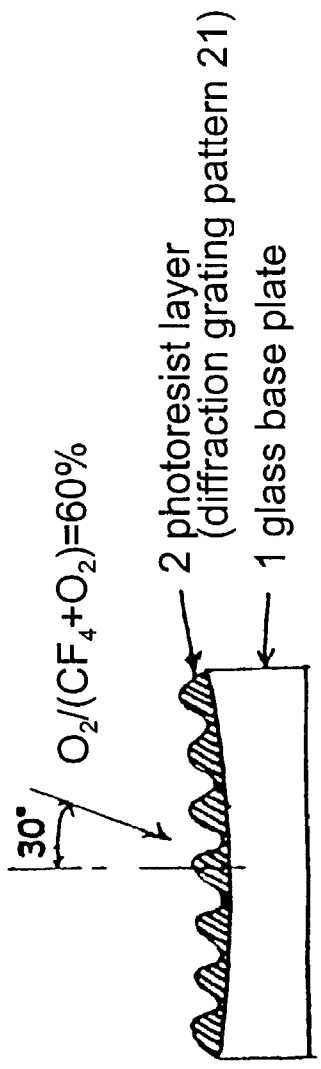
Fig. 1(c)
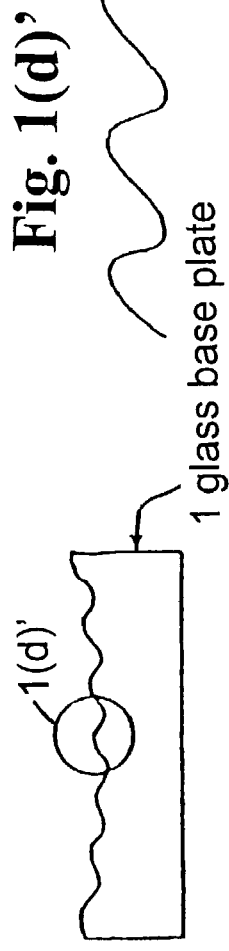
Fig. 1(d)
Fig. 1(d)'
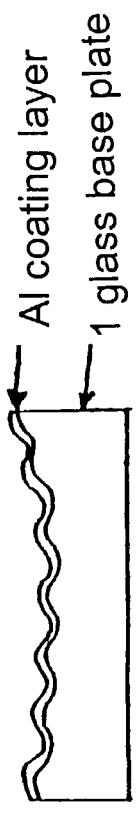
Fig. 1(e)

METHOD OF FORMING HOLOGRAPHIC GRATING

CROSS-REFERENCE TO RELATED APPLICATION

This is a divisional application of Ser. No. 09/735,556, filed on Dec. 14, 2000, now abandoned.

BACKGROUND OF THE INVENTION AND RELATED ART STATEMENT

The present invention relates to a method of manufacturing a grating or diffraction grating as a wavelength separating/selecting element used in a spectroscope or a branching filter, and particularly, the present invention relates to a method of manufacturing a holographic grating by a holographic exposure method.

A grating or diffraction grating is a wavelength separating/selecting element used in a spectroscope, a branching filter, or the like. In generally classifying the forming methods thereof, there have been known a mechanical method, wherein grating grooves are mechanically engraved by a ruling engine; and a holographic exposure method, wherein interference fringes by interference of two beams are exposed and developed in a photoresist layer coated on a base plate, so that a resist pattern having a section in a sine wave form is manufactured. In these gratings, the diffraction grating formed by the holographic exposure method is generally called as a holographic grating.

Since the grating is a precision instrument and requires many procedures to manufacture the same, it generally takes a long time, that is, tens of hours to hundreds of hours, to manufacture the grating, and it is impossible to mass-produce the gratings. Therefore, the grating is very expensive such that a unit price for the grating is several million Yen, and it is inevitable that there are individual differences in performances of the gratings. Thus, a negative grating is formed with a resin from one original grating, and a replica grating is again formed from the negative grating, so that replica gratings are supplied in the market.

A general method for mass-producing the replica grating is as follows. A thin oil film or a metal film made of gold, platinum or the like, which is weak in adhesion, is formed as a parting or separating agent on a lattice surface of a negative grating, and an aluminum thin film is formed by a vacuum deposition on the thin oil film or the metal film. Thereafter, a replica base plate (glass base plate) is attached onto the aluminum thin film by an adhesive, and after setting of the adhesive, the glass base plate is separated from the original or mold. The aluminum thin film is shifted to the glass base plate, and accordingly, there is obtained the replica grating in which grating grooves of the negative grating are transferred.

However, the transferring method as described above is not suitable for mass production. Namely, (1) since the grating grooves are formed in the original grating by the holographic exposure method, the photoresist layer coated on a front surface of the base plate is made of resin and has low intensity; (2) the adhesion force between the base plate and the photoresist layer is low as compared with an adhesion force of a single material; (3) the base plate and photoresist layer are different in expansion coefficient, strength, and hardness. Therefore, in a parting or separating step, a breakage is likely to occur, and for example, at the time of parting, the grating groove becomes deficient, the resist is torn, or an entire resist layer is peeled off from the base plate. As a result, it is able to obtain only about ten sheets of replicas from the one sheet of the original grating. Also, the breakage of the grating is frequent, and a manufacturing efficiency is poor.

In order to avoid the aforementioned disadvantages in the parting or separating operation, it is considered that a replica should be manufactured by using an original grating in which grating grooves are directly engraved in a base plate instead of engraving the grooves in the photoresist layer, and the following method has been attempted. For example, there has been known a method, wherein after exposing a photoresist layer provided on a base plate, the photoresist layer is etched by a known reactive ion beam etching (RIBE) method until the photoresist layer is completely deleted, and a grating pattern on the resist is transferred to a base plate itself as it is. In this method, however, a damage due to the etching is enormous, and extreme deterioration of the grating grooves occurs. Therefore, a diffraction efficiency is not obtained because the shapes of the transferred grooves are bad, or since a rough surface (surface roughness) of the grating grooves becomes rougher than that in the resist pattern, a scattered light component is increased to thereby increase a stray light, so that the grating is not suitable for use in the spectroscope. Also, an entire surface of the grating is stagnated or clouded whitey, so that the exterior commercial value is bad. Thus, the grating which is not accepted in the market can only be made by the aforementioned method.

Accordingly, an object of the invention is to provide a holographic grating, which has an excellent durability, less stray light value, and a high diffraction efficiency while a change of diffraction efficiency in a wide wavelength range is small.

Further objects and advantages of the invention will be apparent from the following description of the invention.

SUMMARY OF THE INVENTION

As a result of a diligent study, as a method for solving the aforementioned problems, inventors of the present invention found that when a mixed gas of a fluorine based gas and oxygen ($O_2$) is used as an etching gas used in the reactive ion beam etching (RIBE) with respect to an optical glass base plate, a direct engravement to the base plate becomes excellent. Incidentally, in this case, a groove pattern for the grating formed by the exposure in the photoresist layer has a groove depth deeper than one time or more of a groove depth to be obtained finally.

In the generally used reactive ion beam etching (RIBE) method, a selection ratio=(etching speed with respect to a base plate)/(etching speed with respect to a resist layer), which is defined according to a kind of the etching gas and materials of the base plate or the resist, becomes an issue in many cases. For example, depending on the selection ratio, the base plate which is an object for etching is not smoothly removed so that a production efficiency is poor, or on the contrary, only the base plate is removed or etched and the sectional form of the grating grooves does not become a desirable one. Therefore, normally, the selection ratio is adjusted by providing a mixed gas containing a halogen based gas as an etching gas such that the etching speed of the base plate is the same or more as that of the resist.

However, by using a method contrary to the general adjustment as mentioned above, the inventors of the invention have reached a method for manufacturing a grating of the invention, in which the etching with respect to the optical base plate can be made excellently. Namely, a resist pattern, which has the depth deeper than that of the grating grooves to be desired finally, is formed in the resist layer on the optical glass base plate in advance, and then a mixed gas of a fluorine based gas and oxygen, which is adjusted such that the etching speed with respect to the resist is faster than the etching speed with respect to the base plate, is used as the etching gas to engrave the grooves in the optical base plate itself. Accordingly, excellent effects in the following have been found.

First, the resist pattern is set to be greater than the depth of the desired grating groove in advance, and by the ion beam etching, the resist pattern is formed to have the desired groove depth finally. Therefore, the deterioration of the grating grooves and the surface roughness thereof due to the damage in the etching, which were problems conventionally, are reduced for the portion of the selection ratio (ratio of the etching speeds of the optical glass base plate with respect to the resist), and rather, surface roughness can be reduced to be smaller than that of the original resist pattern, so that the scattered light component is further reduced. Thus, the excellent grating having a low stray light value can be formed.

Also, there can be solved the conventional problem that the entire surface of the grating is stagnated or clouded whitey to deteriorate the exterior commercial value. The cloudiness appeared on the front surface of the grating results from carbon, and increase of the scattered light component due to the situation that the surface roughness of the resist pattern caused by the noise at the time of exposure or resist particle diameter is increased for the portion of the selection ratio by the base plate etched faster than the resist. In case the ion beam etching is carried out by the fluorine based etching gas only, carbon contained in the photoresist, which is an organic substance, reacts with fluorine in the gas to form a Teflon structure, resulting in preventing the etching. On the other hand, carbon in the gas is deposited on the front surface of the photoresist to become a carbon rich condition, to thereby prevent the etching. Also, the rough surface occurs by continuing the etching while the carbon is deposited on the front surface of the photoresist, and in the extreme case, the shape of the resist pattern is damaged, or the front surface of the grating becomes clouded whitey.

In the present invention, by mixing oxygen with the fluorine based etching gas, carbon deposited on the front surface of the photoresist is reacted with oxygen to form carbon dioxide, so that carbon is removed from the front surface of the resist to obviate the carbon rich condition. Thus, the front surface of the grating can be prevented from being clouded. Also, there is no incident that the front surface of the resist has the Teflon structure to prevent the etching.

Further, since the etching is carried out until all of the resist layer is deleted and the optical glass base plate itself is directly engraved, there is solved the conventional problem that the damage tends to occur at the parting step in case of forming a replica, resulting in improving the durability dramatically. As a result, as compared to the conventional method, in which only ten sheets of the replica can be approximately formed from one sheet of the original grating, in the prevent invention, thousands of sheets of replica can be formed from the original grating, so that the very inexpensive grating can be supplied in the market.

Also, in the aforementioned forming method, the ion beam is irradiated from a direction substantially vertical to the grooving direction at a slant upper side of the base plate, a sectional form of the obtained grating grooves becomes slightly close to a blazed holographic grating. Therefore, there can be formed a high performance grating having a higher diffraction efficiency than that of the conventional holographic grating while an advantage of the holographic grating, that is, a wide using wavelength range, is maintained. Also, since it is possible to adjust which element should be increased between the sine wave shape and the blazed shape, there can be formed the grating having an efficiency distribution optimal to the spectroscope to be used.

BRIEF DESCRIPTION OF THE DRAWINGS

FIGS. 1(a) through 1(h) are schematic views for explaining an embodiment of a holographic grating and a replica grating according to the present invention.

DETAILED DESCRIPTION OF PREFERRED EMBODIMENTS

Hereunder, an embodiment of a method for forming a holographic grating according to the present invention will be explained with reference to the attached drawings.

In FIG. 1(a), numeral 1 designates a base plate or substrate made of optical glass. The base plate is a blank for an original of a diffraction grating, and can be any kind as long as the base plate can be optically polished and the resist can be coated thereon. However, the optical glass is low in coefficient of expansion by a thermal change, and is excellent as a material for the base plate of the diffraction grating which is an optical element. For example, a low-expansion crystal glass, such as BK7, BSC2, Pyrex glass, soda glass, quartz glass, "ZERODUR" (manufactured by Scott Glasswerke), or "CRYSTORON" (manufactured by HOYA CORPORATION), can be used satisfactorily, and in the invention, BK7 glass is used as an example in the present embodiment. Firstly, the BK7 glass (approximately 60 mm×60 mm×11.3 mm) is optically polished to form a concave grating, and a front surface thereof is cleaned by ultrasonic cleaning.

Then, a photoresist layer 2 is formed on the front surface of the base plate 1. The photoresist can be any kind as long as the holographic exposure can be made, and for example, MP1400 (manufactured by "SHIPLEY FAR EAST LTD."), OFPR500 (manufactured by "TOKYO OHKA KOGYO LTD."), or the like, can be used as the photoresist. In the embodiment, after MP1400 is spin-coated at 2,500 rpm for 60 seconds, the MP1400 is baked in a convection oven at 90° C. for 30 minutes to form the photoresist layer 2 having a thickness of 300 nm.

Figure 1F:
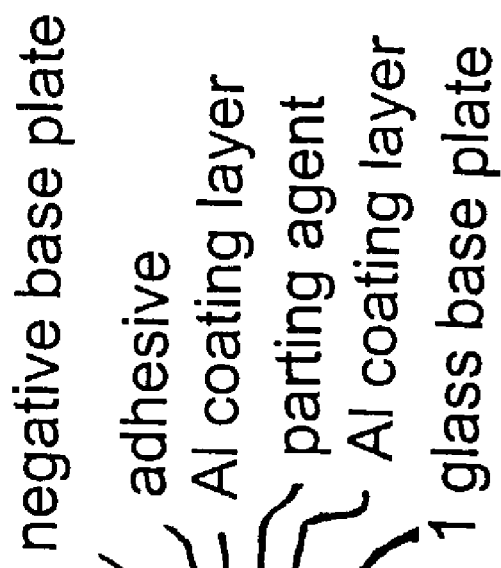
Figure 2:
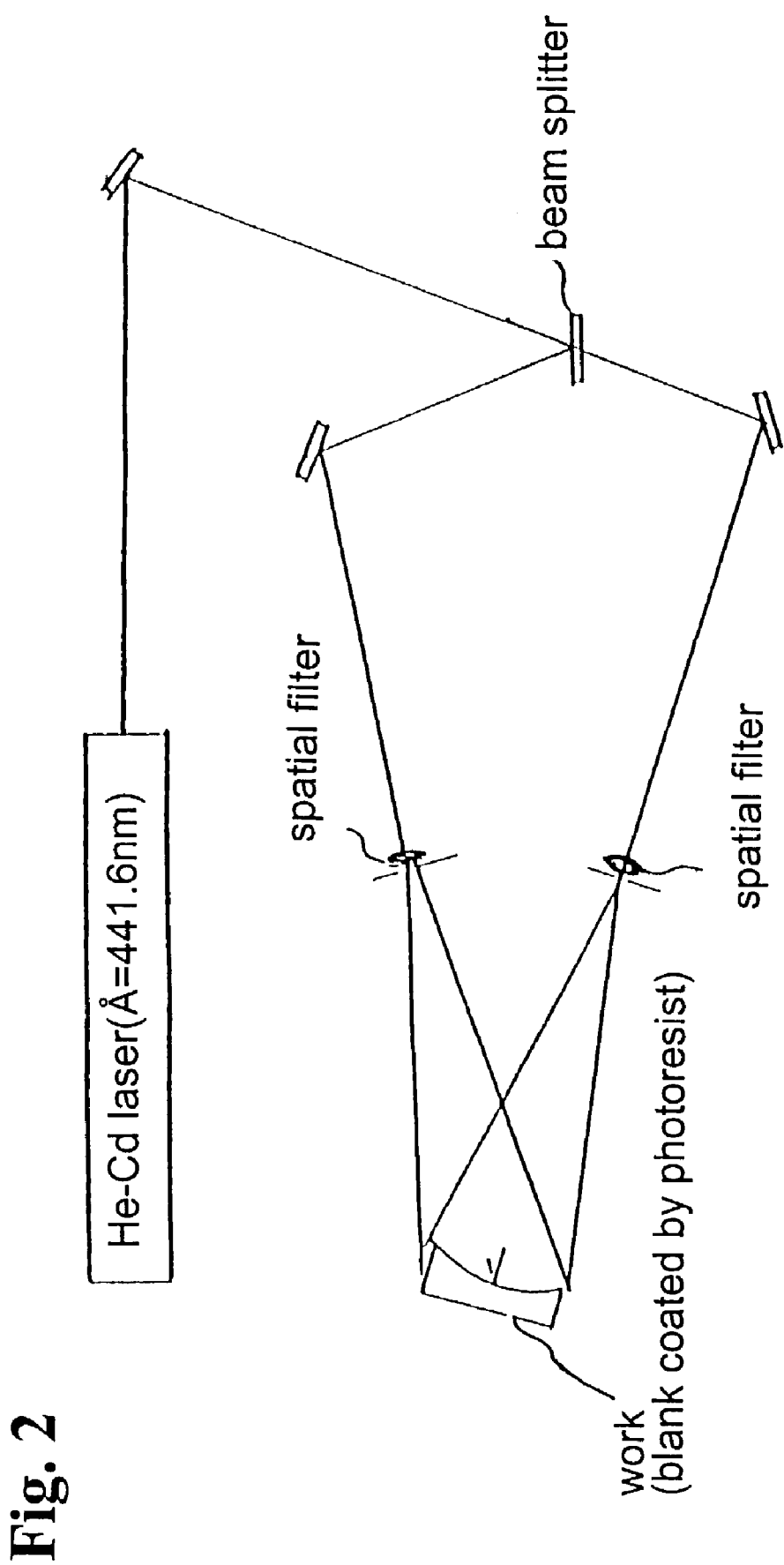
FIG. 2 is a schematic view for explaining a structural example of a holographic exposing device.

A work shown in FIG. 1(a) prepared as described above is set in a holographic exposing device shown in FIG. 2, and a latent image of interference fringes 900/mm is exposed in the photoresist by a holographic exposure method by a two-beam interference of, for example, He—Cd laser ($\lambda$=441.6 nm). Thereafter, a development by a specific developing solution and a pure water rinse are carried out in order, and a diffraction grating pattern of the photoresist is formed (refer to FIG. 1(b)). At this time, since a strength distribution of the interference infringe of the two-beam interference is formed according to a sine wave, the formed diffraction grating pattern 21 of the photoresist has a sectional form in the sine wave form. The groove depth (amplitude of the sine wave form) of the diffraction grating pattern 21 of the photoresist can be determined by controlling the exposure time and the development time, and in the embodiment, the groove depth is 200 nm.

Next, the reactive ion beam etching is conducted (refer to FIG. 1(c)). The etching gas to be used is a mixed gas of $CF_4$ (carbon tetrafluoride) and $O_2$ (oxygen), which has a mixture ratio: $O_2/(CF_4+O_2)=60\%$ and a gas pressure of $1.5\times10^{-4}$ Torr, and the etching gas is irradiated from a direction, which is vertical to the groove engraving direction of the resist pattern and slanted at 30 degrees on an upper side from a normal line of the base plate. The etching is continued for about 10 minutes until the resist pattern disappears and the pattern is completely directly engraved or formed in the BK7 glass base plate 1, and there is formed a diffraction grating in the sine wave form, in which the groove depth is 65 nm and the groove shape is slightly inclined to the incident direction of ions (refer to FIG. 1(d)). FIG. 1(d)' shows a part of the sectional form of the groove taken out from FIG. 1(d) and enlarged.

The sectional form of the groove is made to have a shape slightly inclined from the sine wave, so that the holographic grating has two advantages, i.e. due to the sinewave-formed section, a change of the diffraction efficiency in the wide wavelength band is small, and due to a blazed grating having a serrated sectional form, the diffraction efficiency is high. Also, by changing the incident angle of the ion beam, an inclination amount of the sectional form can be adjusted, and by adjusting a ratio of the sine wave form to the blazed form, the diffraction efficiency distribution is adjusted, so that the grating optimal to the spectroscope is made.

Incidentally, since the mixing ratio of $CF_4$ to $O_2$ in the etching gas to be used is determined by the height of the resist pattern formed first, the mixing ratio is not limited to the one in the aforementioned embodiment, and a value of the mixing ratio optimal for each case can be selected from the range of $O_2/(CF_4+O_2)=0.1$ to 0.9. Also, the etching gas to be used is not limited to the mixed gas of $CF_4$ and $O_2$, and the etching gas can be a mixed gas of the fluorine based gas, such as $CHF_3$, $CBrF_3$, or the like, and $O_2$. In short, the objects are to form a resist pattern having a groove depth, which may be more than 1.5 times, deeper than the groove depth of the diffraction grating to be obtained finally; to eliminate the carbon rich condition on the etching surface by using the etching gas in which $O_2$ is mixed; and to reduce the surface roughness by adjusting the selection ratio of the etching.

Also, regarding the incident angle of ions, assuming that the direction of the normal line of the base line is zero degree, as the incident angle is increased, a peak value of the diffraction efficiency becomes larger. However, since the change of the diffraction efficiency is large in the wide wavelength band, in accordance with a desired specification, that is, how much the peak value of the efficiency and how much the change of the efficiency should be kept, the incident angle of ions can be freely set in the range of 10 degrees to 80 degrees, and the incident angle itself is not important.

In the diffraction grating formed as described above, in case a number of grooves is 900/mm and the groove depth is 65 nm, the peak of the efficiency will be approximately 220 nm, to constitute the efficiency distribution optimal for use in an ultraviolet visible spectroscope. The efficiency in the conventional holographic grating, in which the diffraction grating grooves are formed of the resist, is about 30 percent. On the other hand, the efficiency in the diffraction grating of the present embodiment is 39 percent, resulting in the approximately 30 percent increase or improvement as compared with the conventional one.

After cleaning the original grating in which the etching is completed, coating by a material optimal to the wavelength range to be used is carried out in a vacuum deposition device (FIG. 1(e)). Depending on the wavelength range to be used, since the original grating has a sufficiently high reflectance, the original grating may be sufficiently usable as it is. However, in other wavelength ranges, in accordance with the necessity, the original grating is coated with gold (Au), platinum (Pt), or an X-ray multilayer film to thereby increase the reflectance and durability, and then, the coated grating is used. In the embodiment, aluminum (Al), which has a high reflectance in a range from an ultraviolet region to a visible region, is coated.

Next, a method for forming a replica grating from the original grating will be explained (refer to FIG. 1(f)). Again, in the vacuum deposition device, a thin oil film (thickness of about 1 nm) is formed as a parting agent by, for example, a silicone grease on the original grating, and then an aluminum thin film (thickness of 0.2 μm) is vacuum-deposited thereon. After the grating is taken out from the vacuum deposition device, a negative base plate (glass base plate or the like) is attached thereto by an adhesive.

Although an epoxy resin is used as the adhesive in the present embodiment, the adhesive is not limited thereto, and other thermosetting resin having the thermal resistance, such as urea resin, melanin resin, and phenolic resin, can be used as the adhesive. If BENEF IX VL (manufactured by "ADELL Co., Ltd."), that is a visible light hardening resin, is used as the adhesive, an effect of a thermal distortion can be reduced. Also, the elastic adhesive EP-001 (manufactured by Cemedine Co., Ltd.) can be also used as the adhesive.

Figure 1G:
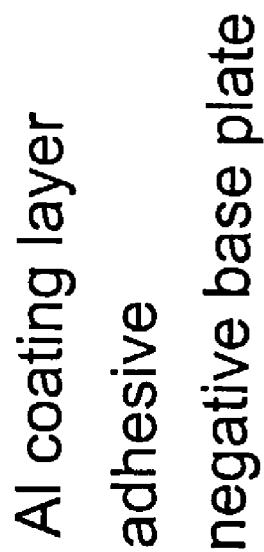
Figure 1H:
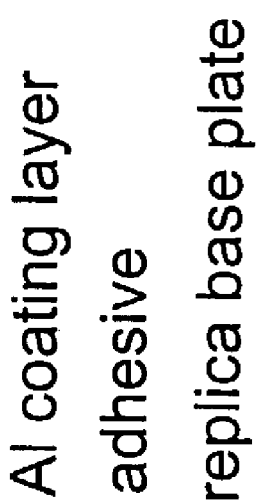

When the negative base plate is separated from the original grating (mold or matrix) after the adhesive is hardened, the negative base plate is separated at the parting agent as the boundary. After parting, the parting agent remained on the surface of the negative base plate is cleaned by a solvent, such as Freon, and removed. Accordingly, there can be obtained the negative grating having a front surface in which the diffraction grating grooves for the original grating are transferred (FIG. 1(g)).

In the conventional grating, since the grooves are formed in the fragile resist layer, the resist layer is peeled off from the base plate at the step of parting or separating the negative base plate, so that the durability was poor. On the other hand, in the grating of the invention, the grooves are directly engraved in the BK7 glass base plate, the grating is excellent in durability, and a large number of replicas or reproductions can be formed.

Also, in the grating of the invention, since the grooves are directly engraved in the BK7 glass base plate, there can be solved the problem of the conventional grating, in which the grooves are formed in the resist layer. Namely, since expansion coefficients of the resist and the base plate are different to cause the different contraction coefficients at the time of hardening and cooling the epoxy resin as the adhesive in the negative base plate, the fine diffraction grating grooves may change, so that the grooves of the original grating and the grooves of the negative grating bite each other to thereby disable the separation.

Further, the surface roughness after transfer is solved, and the stray light is held down to be low. When the replica grating of the embodiment is mounted in an ultraviolet visible spectrophotometer UV1200 (manufactured by Shimadzu Corporation) to compare a stray light value thereof with that of the conventional grating, while the stray light value of the conventional grating is 0.024%, the stray light value of the grating of the invention is 0.0061%, so that the stray light value can be improved to be extremely excellent. Since the stray light value includes a value contained in the spectrophotometer itself other than that of the grating, it is possible to say that the stray light value of the grating itself can be minimized to the limit.

The method of forming the replica grating is the same as in the negative grating. In the negative grating, a parting agent layer and an aluminum thin film are formed, and after a replica base plate is bonded by the adhesive, the separation is carried out. The grooves of the negative grating are again transferred, and as a result, the replica grating has the same grooves as those of the original grating. By repeating these steps, a large number of replica grating is formed. In the replicating procedure, even if the front surface of the original grating is damaged, the coating is peeled off and the original grating is coated again, so that the original grating can be used again. Thus, the grating is extremely excellent in durability, and it becomes possible to reproduce thousands of sheets of replica gratings from one sheet of the original grating. This enables not only to supply the replica grating at a low cast in the market, but also to reduce the unevenness of the performance of the replica grating, resulting in the effect that the grating with a stable quality can be provided.

Incidentally, in the embodiment of the invention, in order to form the concave grating, after transferring the original grating in the negative grating, transferring is carried out again to obtain the replica grating. However, in case of forming a flat grating, it is possible to directly transfer to the replica grating. Also, by means of a known forming method and the replication method, adequately modified embodiments are available.

Since the holographic grating according to the present invention is structured such that diffraction grating grooves, which are conventionally used to be engraved in the resist, are directly engraved in the glass base plate, the durability of the grating can be extremely improved. Therefore, in the steps of forming the replicas or reproductions, there is no inconvenience that the resist is peeled off or the grooves are chipped at the time of separation, and thousands of sheets of the replica gratings can be reproduced from one sheet of the original grating, so that the unit price can be extremely lowered. Also, since the original grating is common, there is no unevenness in performances of replicas formed from the common original grating, so that the stable quality can be guaranteed.

Also, in the steps of forming the grating, the groove height of the grating pattern formed in the resist is set high one time or more relative to the groove height of the grating to be obtained finally, and then, a selection ratio is adjusted such that the etching speed with respect to the resist is faster than the etching speed with respect to the base plate. Therefore, the surface roughness of the front surface of the grating obtained as a result of the etching is reduced partly by the selection ratio, and rather, the surface damage due to the etching is reduced, resulting in an incomparable effect that the excellent grating with the low stray light value can be formed.

Also, in the reactive ion beam etching step, since the mixed gas of the fluorine based gas and oxygen is adopted as the etching gas with respect to the optical glass base plate, in addition to adjusting the section ratio in the etching, the carbon rich condition on the etching surface can be solved, to thereby increase the etching efficiency. At the same time, there can be solved the problem of the cloudiness of the front surface of the grating.

Furthermore, in case of etching, the ion beam is irradiated from the direction, which is vertical to the grooving direction of the resist pattern and is inclined with respect to the normal line of the base plate, so that the sectional form of the grating grooves has a substantially sine wave slightly close to the serrated form (inclined toward the incident direction of the ions). Therefore, there can be formed the grating which has both advantage such that due to the sinewave-formed section of the holographic grating, a change of the diffraction efficiency is small in the wide wavelength band, and due to the blazed grating having a serrated sectional form, the diffraction efficiency is high. By adjusting the sectional form of the grooves to be close to one of the sine wave form and blazed form, it is possible to form the grating which has a diffraction efficiency distribution with regard to the wavelength which is optimal to the spectroscope to be used.

While the invention has been explained with reference to the specific embodiments of the invention, the explanation is illustrative and the invention is limited only by the appended claims.

What is claimed is:

1. A method of forming a holographic grating, comprising:
    providing a photoresist layer on an optical substrate, forming a resist pattern in the photoresist layer to have a depth of grooves deeper than a predetermined depth of diffraction grating grooves to be formed,
    preparing a mixed gas containing a fluorine based gas and oxygen, said mixed gas having a mixing ratio of the fluorine based gas and oxygen such that an etching speed to the photoresist layer is greater than that to the optical substrate, and
    etching the photoresist layer with the resist pattern by an ion beam generated by the mixed gas containing the fluorine based gas and oxygen until the resist pattern substantially completely disappears so that the diffraction grating grooves having the predetermined depth are directly engraved on the optical substrate,
    wherein said ion beam, in etching the photoresist, is irradiated from a direction perpendicular to a direction of the grooves of the resist pattern and inclined with respect to a direction of a normal line of the substrate.

2. A method of forming a holographic grating according to claim 1, wherein said diffraction grating grooves are transferred from the holographic grating to form a negative grating, said diffraction grating grooves transferred in the negative grating being further transferred to form a replica grating.

3. A method of forming a holographic grating according to claim 1, wherein said optical substrate is an optical glass substrate, said resist pattern being engraved in the photoresist layer by an exposure method.

4. A method of forming a holographic grating according to claim 1, further comprising providing a metal coating on the substrate with the diffraction grating grooves.

5. A method of forming a holographic grating according to claim 2, wherein said negative grating is formed by providing a parting agent on the substrate with the diffraction grating grooves, forming a metal layer on the parting agent, providing an adhesive agent onto the metal layer, adhering a negative substrate on the adhesive agent to connect the negative substrate to the metal layer, and separating the negative substrate with the metal layer from the holographic grating.

6. A method of forming a holographic grating according to claim 5, wherein after the negative grating is formed, said replica grating is formed by providing a parting agent on the negative grating with negative diffraction grating grooves, forming a second metal layer on the parting agent, providing a second adhesive agent onto the second metal layer, adhering a replica substrate on the second adhesive agent to connect the replica substrate to the second metal layer, and separating the replica substrate with the second metal layer from the negative grating.

7. A method of forming a holographic grading according to claim 1, wherein said ion beam, in etching the photoresist, is irradiated from a direction perpendicular to a direction of the grooves of the resist pattern and inclined with respect to a direction of a normal line of the substrate.

* * * * *